US008008584B2

(12) United States Patent
Tu et al.

(10) Patent No.: US 8,008,584 B2
(45) Date of Patent: Aug. 30, 2011

(54) PANEL CIRCUIT STRUCTURE

(75) Inventors: Ming-Hung Tu, Hsin-Chu (TW); Yung-Tse Cheng, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 377 days.

(21) Appl. No.: 12/407,235

(22) Filed: Mar. 19, 2009

(65) Prior Publication Data

US 2010/0013507 A1 Jan. 21, 2010

(30) Foreign Application Priority Data

Jul. 15, 2008 (TW) .............................. 97126752 A

(51) Int. Cl.
*H05K 1/16* (2006.01)

(52) U.S. Cl. ........................................................ 174/260

(58) Field of Classification Search .................. 174/260, 174/257, 251; 361/767, 760; 257/700, 737, 257/686; 439/66–68

See application file for complete search history.

(56) References Cited

U.S. PATENT DOCUMENTS 4,643,526 A * 2/1987 Watanabe et al. ............. 349/151
4,955,695 A * 9/1990 Kubo et al. ................... 349/151
5,608,559 A * 3/1997 Inada et al. ................... 349/149
6,059,624 A * 5/2000 Dehaine et al. ................. 445/24
6,452,807 B1 * 9/2002 Barrett .......................... 361/767
6,930,744 B1 8/2005 Ukita
7,268,416 B2 9/2007 Furihata
7,518,690 B2 * 4/2009 Komaju ........................ 349/151
7,663,396 B2 * 2/2010 Kawata .................... 324/760.01
7,787,096 B2 * 8/2010 Ohgiichi et al. .............. 349/152

OTHER PUBLICATIONS

English language translation of abstract of JP 11305251.

* cited by examiner

*Primary Examiner* — Jean Duverne

(74) *Attorney, Agent, or Firm* — Thomas, Kayden, Horstemeyer & Risley, LLP

(57) ABSTRACT

A panel circuit structure for transmitting electrical signals to an active area is provided. The panel circuit structure includes a first transmission pad, a first test pad, a second transmission pad, a second test pad, and a third transmission pad, which are connected to a driving element. The first transmission pad, the first test pad, the second transmission pad, and the second test pad transmit electrical signals to the active area via the first transmission lines and second transmission lines. The first transmission pads and the second transmission pads are disposed at a first end of the driving element while the third transmission pad is disposed at a second end of the driving element. The first and second test pads are disposed outside the coverage area of the driving element.

11 Claims, 7 Drawing Sheets

PANEL CIRCUIT STRUCTURE

BACKGROUND OF THE INVENTION

1. Field of the Invention

This invention relates to a panel circuit structure and more specifically to a panel circuit structure used in the test of liquid crystal display (LCD) and organic light emitting diode (OLED) display.

2. Description of the Prior Art

Flat panels and flat display devices using the flat panels are gradually becoming the mainstream in various types of display devices. For instance, panel displays, home flat televisions, flat screen monitors used in personal computers and laptops, and display screens of mobile phones and digital cameras are electronic products which extensively incorporate flat panels. Especially the recent demands for liquid crystal display and organic light emitting diode display have a significant increase, and thus it is important to improve the precision and speed in the test of flat panel in order to meet the future production demand and also to ensure the quality of final products.

Reducing the thickness of the driving element of the flat display device has always been one of the main objectives of the present flat display device industry. However, the thickness of the conventional display panel is still not ideal according to the demands of the consumers. The conventional panel circuit structure includes test pads for transmitting test signals and transmission pads for transmitting image signals. Thus how to avoid short circuit between the test pad and the transmission pad and to reduce the size of the driving element have become an important issue in the present flat display device industry.

SUMMARY OF THE INVENTION

It is an object of the present invention to provide a panel circuit structure to reduce the limitation on the size of driving element.

It is another object of the present invention to provide a panel circuit structure to reduce the costs of producing the display panel.

A plurality of first transmission strings and a plurality of second transmission strings are disposed on a substrate, wherein each first transmission string includes a first transmission pad and a first test pad. Similarly, each second transmission string includes a second transmission pad and a second test pad. The first test pad and the second test pad for receiving test signals in the panel test are disposed outside the projection area of the driving element. On the substrate, the first transmission pad and the second transmission pad are adjacent to each other without any intervening element. In such a structure, the first transmission pad and the second transmission pad can avoid being short-circuited respectively with the first test pad and the second test pad which also reduces the limitation on height and size of the driving element.

DETAILED DESCRIPTION OF THE PREFERRED EMBODIMENT

The present invention provides a panel circuit structure to be used in panel tests, and a driving element is disposed on the panel circuit structure after the panel test. The driving element receives external image signals and outputs a driving signal according to the received image signal to a display panel to generate images. In a preferred embodiment, the panel circuit structure of the present invention is disposed on a liquid crystal panel produced in a chip on glass process, but is not limited thereto. In a different embodiment, the panel circuit structure of the present invention can also be disposed on an organic light emitting diode panel produced in a chip on glass process. Furthermore, the panel circuit structure of the present invention is used to transmit driving signals from the driving element to an active area of the display panel, but is not limited thereto. The panel circuit structure of the present invention can also be used to transmit other electrical signals, such as touch position signals.

Figure 1:
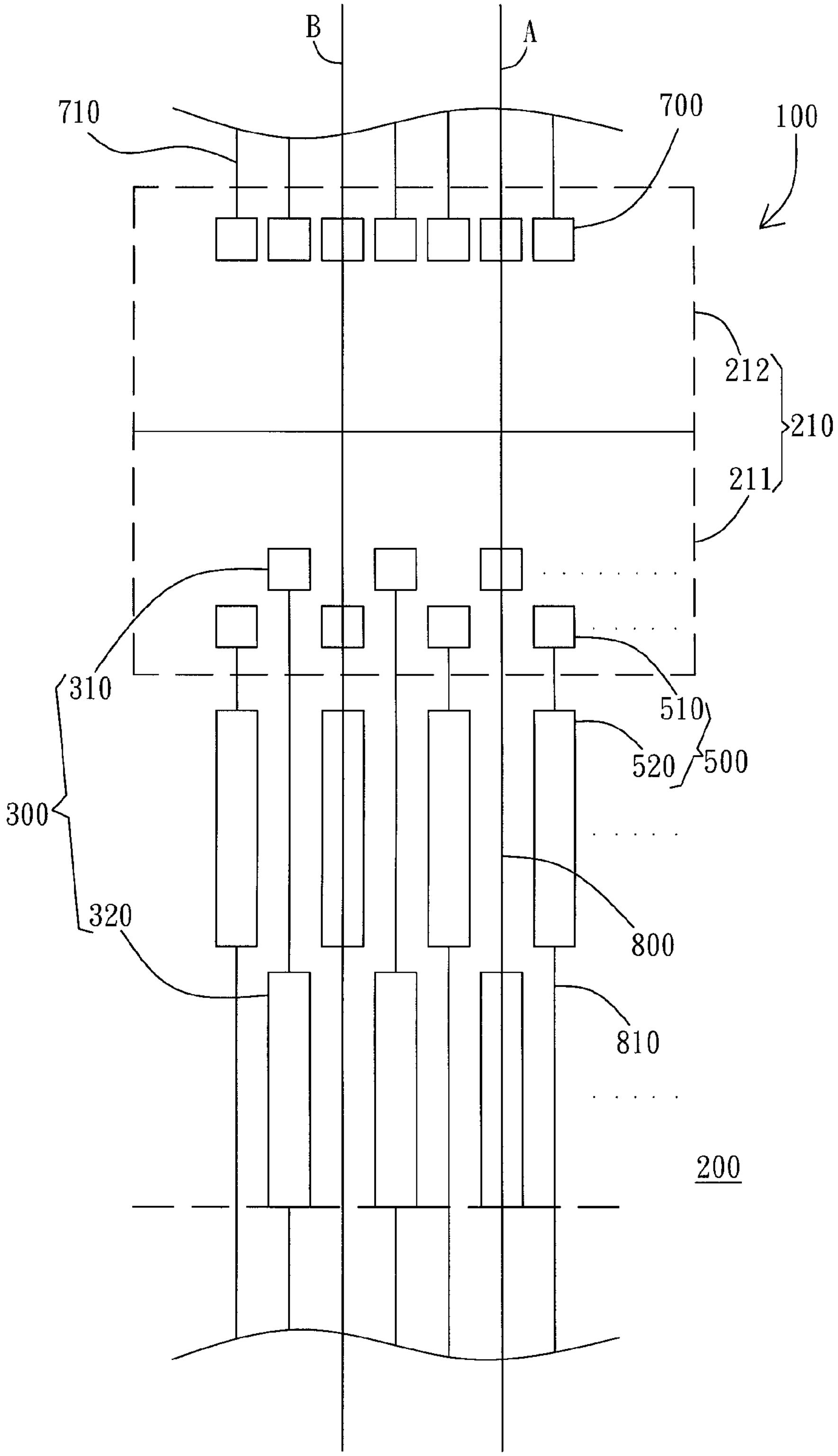
FIG. 1 is a top view of a preferred embodiment of a panel circuit structure of the present invention.

FIG. 1 is a top view of a preferred embodiment of the present invention. As shown in FIG. 1, the driving element 210 is disposed on substrate 200, wherein the driving element 210 includes a first end 211 and a second end 212. In the present embodiment, the first end 211 and the second end 212 are respectively two opposite ends of the driving element 210, but are not limited thereto. The panel circuit structure 100 includes a plurality of first transmission strings 300 and a plurality of second transmission strings 500, all disposed on the substrate 200. Each first transmission string 300 includes a first transmission pad 310 and a corresponding first test pad 320 while each second transmission string 500 includes a second transmission pad 510 and a corresponding second test pad 520. The first transmission pad 310 and the second transmission pad 510 are electrically connected to the driving element 210 for receiving and transmitting image driving signals, wherein the first transmission pad 310 and the second transmission pad 510 are close to the first end 211 of the driving element 210. The first transmission string 300 and the second transmission string 500 can be used to transmit electrical signals, such as image driving signals or test signals. The first transmission pad 310 is substantially identical to the second transmission pad 510, while the first test pad 320 is substantially identical to the second test pad 520. In other words, the first transmission string 300 is substantially identical to the second transmission string 500. In the present embodiment, a distance between the first transmission pad 310 and the corresponding first test pad 320 is greater than that between the second transmission pad 510 and the corresponding second test pad 520. Furthermore, the second transmission pad 510 and the second test pad 520 are located on an area between the first transmission pad 310 and the first test pad 320. In other words, the second transmission pad 510 and the second test pad 520 are disposed between the first transmission pad 310 and the first test pad 320.

Furthermore, as shown in FIG. 1, the first transmission pad 310 and the second transmission pad 510 are disposed on the substrate 200 close to the driving element 210. The first test pad 320 and the second test pad 520 are disposed on the substrate 200 closer to the active area and also distant from driving element 210. In other words, the second transmission pad 510 is relatively closer to the first transmission pad 310 than the second test pad 520 is. The second test pad 520 is relatively closer to the first test pad 320 than the second transmission pad 510 is. In the present embodiment, the second test pad 520 is located between the second transmission pad 510 and the first test pad 320. One end of the first test pad 320 is close to the second test pad 520, while the other end is close to the active area. In the present embodiment, the first transmission pads 310 and the second transmission pads 510 together form a trapezoid shape, but are not limited thereto. The transmission pads and the test pads can be aligned or arranged to form other shapes.

As shown in FIG. 1, the panel circuit structure 100 of the present invention can further include a plurality of first transmission lines 800 and a plurality of second transmission lines 810 disposed on the substrate 200. In the present embodiment, the first transmission line 800 is aligned with the first transmission string 300 and is electrically connected respectively with the first transmission pad 310 and the first test pad 320. Similarly, the second transmission line 810 is aligned with the second transmission string 500 and is electrically connected with the second transmission pad 510 and the second test pad 520. One end of the first transmission line 800 and one end of the second transmission line 810 are electrically connected to thin-film transistors (not illustrated) of the liquid crystal panel, while the other ends are electrically connected to the driving element 210. Furthermore, the end of the first test pad 320 near the active area (or away from the second test pad 520) is defined as a starting location of a fanout area. The fanout area is defined as the area where the first transmission lines 800 and the second transmission lines 810 are disposed thereon.

As shown in FIG. 1, the panel circuit structure 100 also includes a plurality of third transmission pads 700 and a plurality of third transmission lines 710. The third transmission pads 700 are disposed on a part of substrate 200 near the second end 212 of the driving element 210. One end of the third transmission pad 700 is electrically connected to the corresponding third transmission line 710, while the other end is electrically connected to the driving element 210.

In the embodiment illustrated in FIG. 1, the third transmission line 710 receives an inputted external signal and transmits the inputted external signal to the driving element 210 to generate a corresponding output signal. The first transmission pad 310 and the second transmission pad 510 are electrically connected to the driving element 210 for receiving the output signals from the driving element 210. The first test pad 320 and the second test pad 520 are electrically connected to test probes (not illustrated) for the substrate 200 to be tested before the driving element 210 is disposed on the substrate 200. The first test pad 320 and the second test pad 520 receive test signals, wherein the test signals preferably emulate the actual driving signals outputted by the driving element 210. The first transmission pad 310 and the second transmission pad 510 receive the driving signals and transmit the driving signals to the active area via the first transmission line 800 and the second transmission line 810, respectively. Similarly, the first test pad 320 and the second test pad 520 receive test signals and input the test signals to the active area via the corresponding first transmission line 800 and the corresponding second transmission line 810. In the present embodiment, the first transmission line 800 and the second transmission line 810 are electrically connected to the thin-film transistors of the liquid crystal display, but are not limited thereto. The first transmission line 800 and the second transmission line 810 can be electrically connected to a light emitting layer of the organic light emitting diode. As shown in FIG. 1, the driving element 210 and the substrate 200 are spaced by only the first transmission pads 310 and the second transmission pads 510 close to the first end 211 of driving element 210 and the third transmission pad 700 close to the second end 212. In this way, the dimension of the driving element 210 can be reduced without short-circuiting the transmission pads and the test pads so that the usable area of the substrate 200 is increased and the production cost is reduced.

Figure 2:
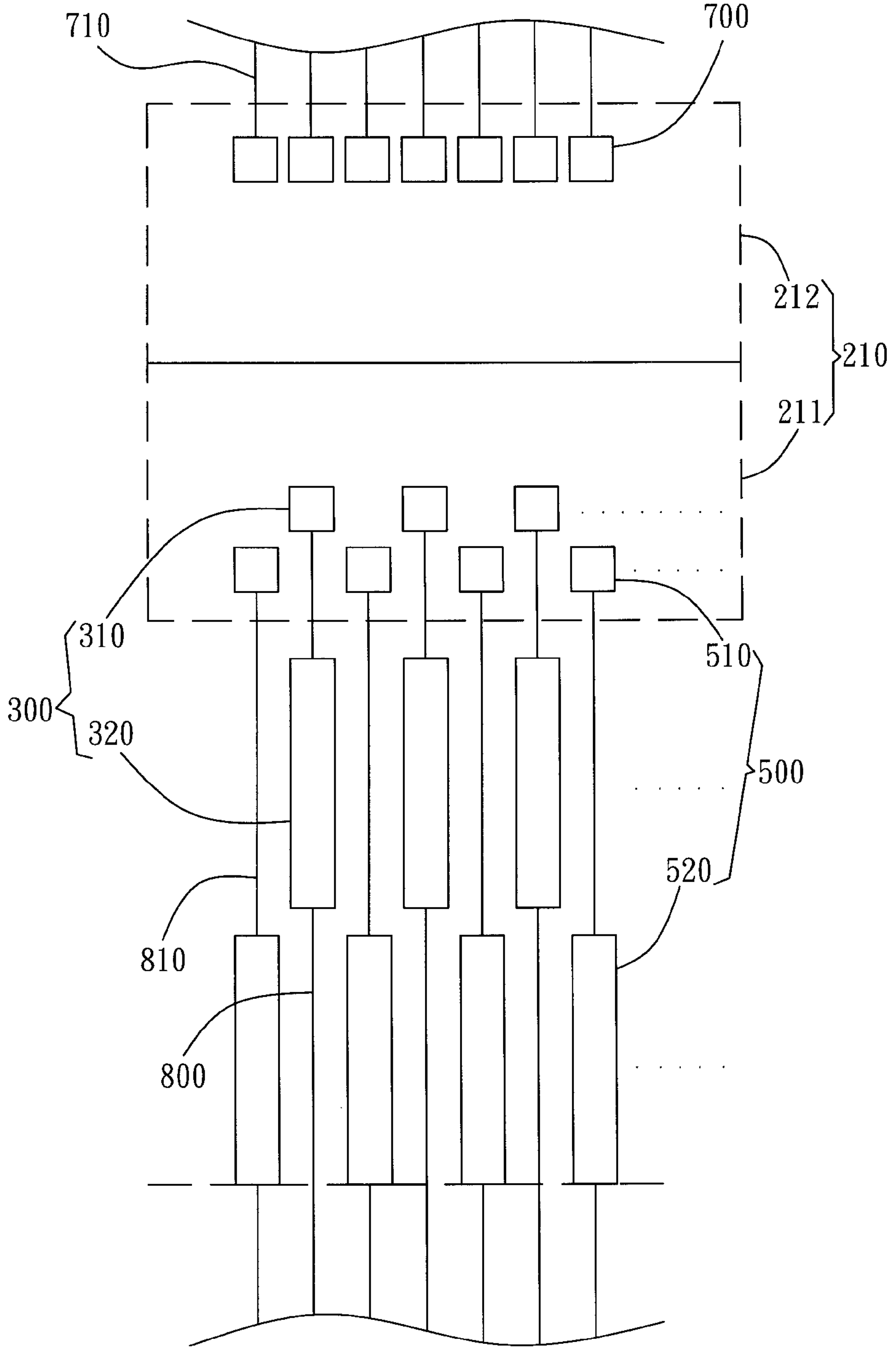
FIG. 2 is a top view of another preferred embodiment of a panel circuit structure of the present invention.

FIG. 2 illustrates a modification to the embodiment illustrated in FIG. 1. In the present embodiment, the first test pad 320 is disposed between the second transmission pad 510 and the second test pad 520. Thus, the second test pads 520 are closer to the active area than the first test pads 320 are, while the first test pads 320 are closer to the driving element 210 than the second test pads 520 are. In the present embodiment, the panel circuit structure 100 includes first transmission pads 310, second transmission pads 510, first test pads 320, second test pads 520, first transmission lines 800, and second transmission lines 810 with connections similar to those of the previous embodiment, and thus will not be elaborated hereinafter.

Figure 3:
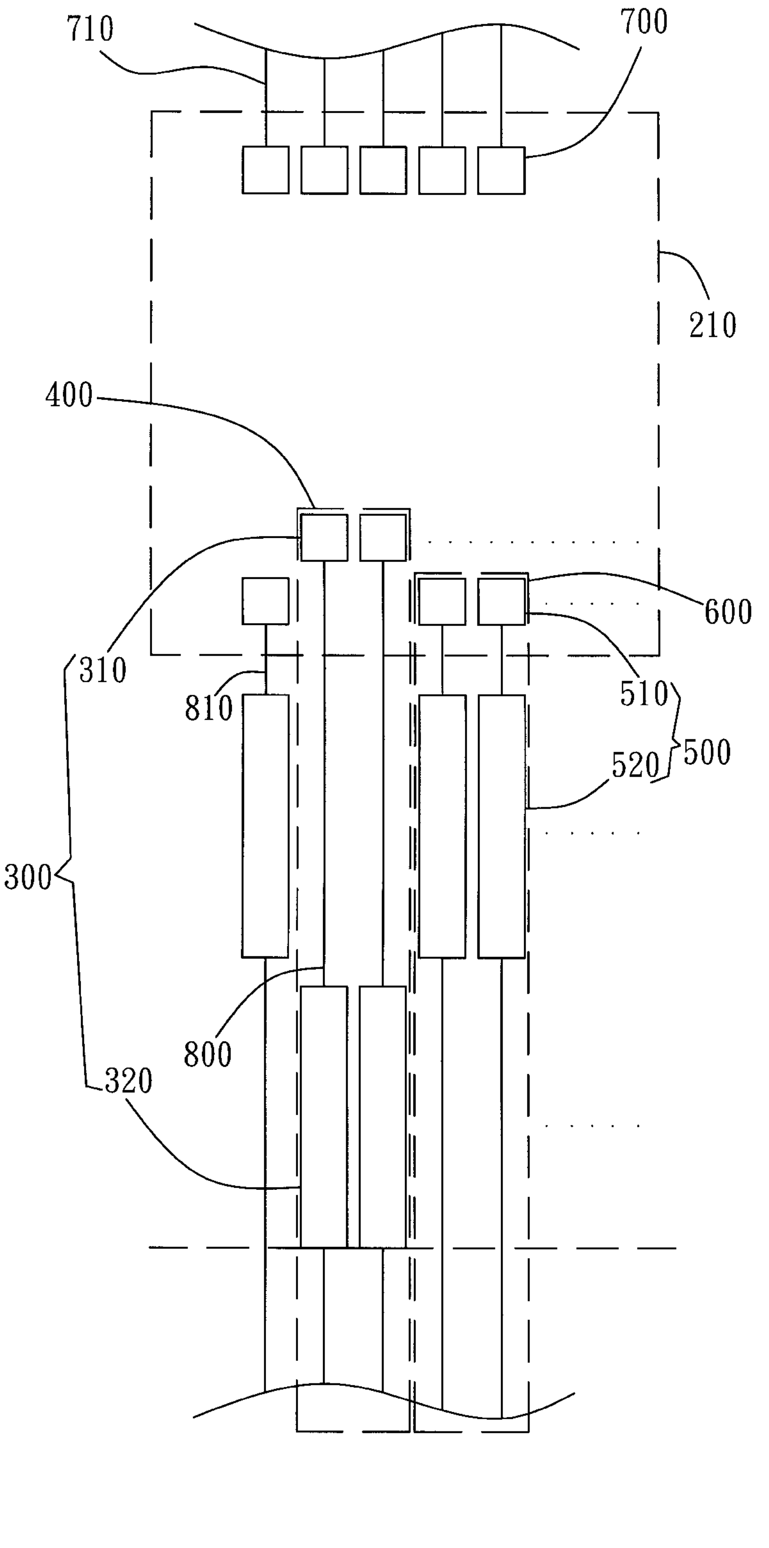
FIG. 3 is a top view of yet another preferred embodiment of a panel circuit structure of the present invention.

FIG. 3 illustrates yet another embodiment of the panel circuit structure 100 of the present invention. As shown in FIG. 3, in the present embodiment, two first transmission strings 300 form a first transmission set 400, and two transmission strings 500 form a second transmission set 600. The first transmission strings 300 of the first transmission set 400 are preferably adjacent and disposed on the substrate 200. Similarly, two second transmission strings 500 of the second transmission set 600 are preferably adjacent and disposed on the substrate 200. Furthermore, every first transmission set 400 is preferably placed adjacent to one second transmission set 600.

Figure 4:
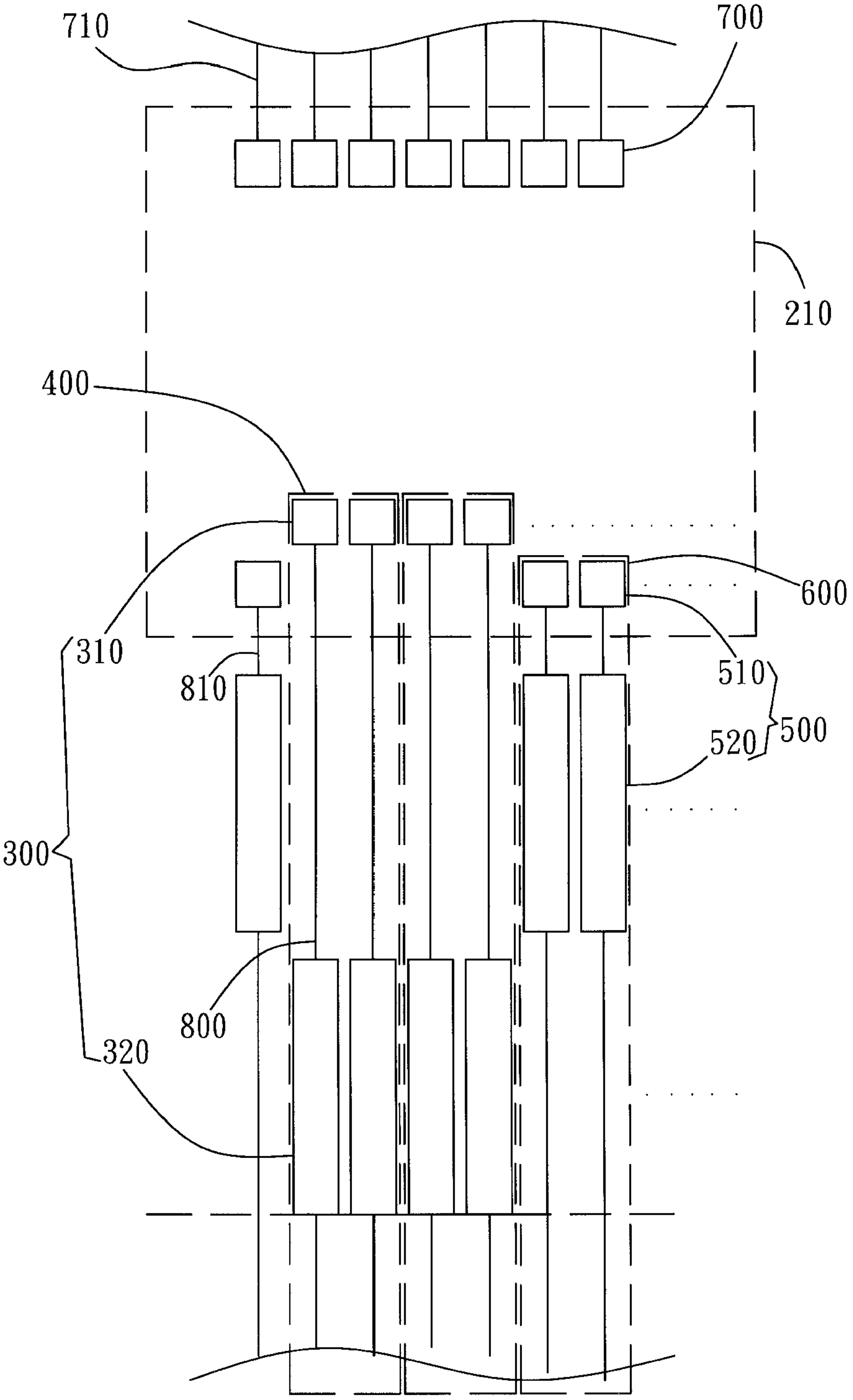
FIG. 4 is a modification of the embodiment illustrated in FIG. 3.

In yet another embodiment illustrated in FIG. 4, a plurality of first transmission sets 400 are arranged side by side. That is, at least two first transmission sets 400 are adjacent to each other and no second transmission set 600 is interposed therebetween. Similarly, a plurality of second transmission sets 600 are arranged side by side. That is, at least two second transmission sets 600 are adjacent to each other and no first transmission set 400 is interposed therebetween. In the present embodiment, the panel circuit structure 100 includes first transmission pads 310, second transmission pads 510, first test pads 320, second test pads 520, first transmission lines 800, and second transmission lines 810 with connections similar to those of the previous embodiment, and thus will not be elaborated hereinafter.

Figure 5:
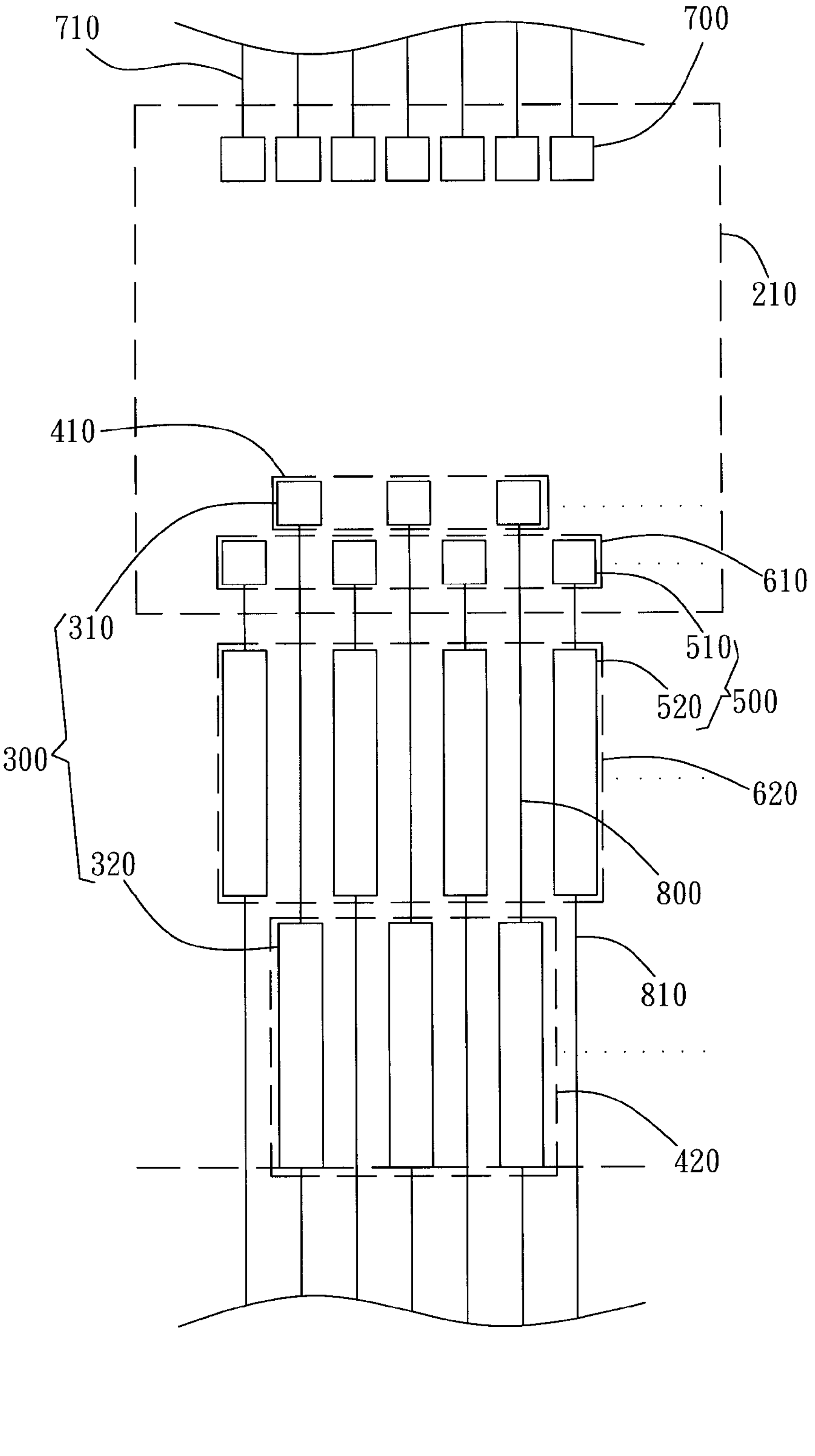
FIG. 5 illustrates yet another preferred embodiment of a panel circuit structure of the present invention.

FIG. 5 is a top view of another embodiment of a panel circuit structure 100 of the present invention. As shown in FIG. 5, the panel circuit structure 100 of the present invention includes a first transmission row 410, a second transmission row 610, a first test row 420, and a second test row 620 parallel to each other, but are not limited thereto. The first transmission row 410 and the second transmission row 610 are preferably disposed below the driving element 210, but are not limited thereto.

In the embodiment illustrated in FIG. 5, the second test row 620 is closer to the driving element 210 than the first test row 420 is, and the first test row 420 is closer to the active area than the second test row 620 is. In other words, the second transmission row 610 and the first test row 420 are located between the first transmission row 410 and the second test row 620. As it can be seen from FIG. 5, the first transmission row 410 includes a plurality of first transmission pads 310, and the second transmission row 610 includes a plurality of second transmission pads 510. The first test row 420 includes a plurality of first test pads 320, and the second test row 620 includes a plurality of second test pads 520. The panel circuit structure 100 of the present embodiment further includes a plurality of first transmission lines 800 and second transmission lines 810. The portion of the substrate 200 onto which the first transmission lines 800 and second transmission lines 810 are disposed is defined as the fanout area. The first test row 420 of the present embodiment is disposed between the fanout area and the second test row 620. In the present embodiment, the panel circuit structure 100 includes first transmission pads 310, second transmission pads 510, first test pads 320, second test pads 520, first transmission lines 800, and second transmission lines 810 with connections similar to those of the previous embodiment, and thus will not be elaborated hereinafter.

Figure 6:
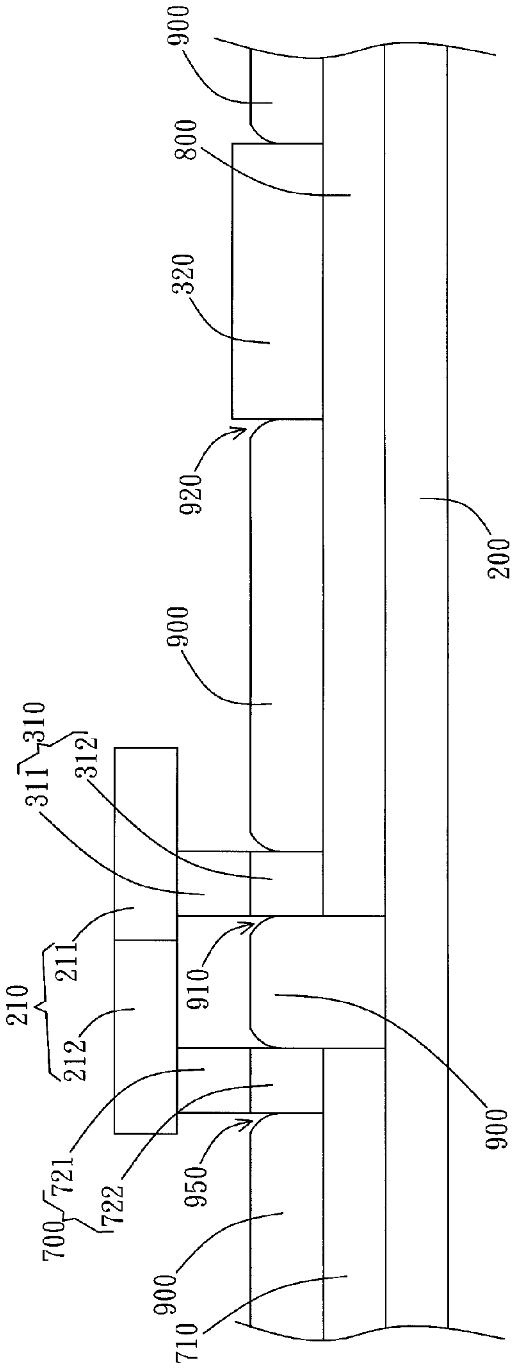
FIG. 6 and FIG. 7 are respectively cross-sectional views of the first transmission string and the second transmission string illustrated in FIG. 1.
Figure 7:
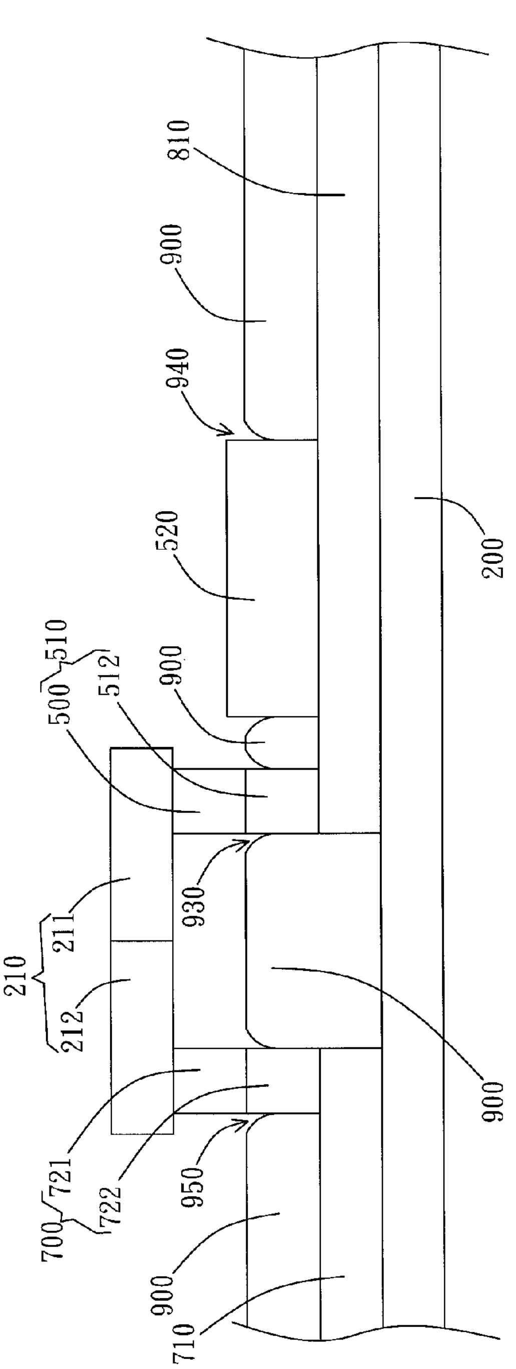

FIG. 6 and FIG. 7 are respectively cross-sectional views of the panel circuit structure 100 illustrated in FIG. 1. FIG. 6 illustrates the cross-sectional view of the panel circuit structure 100 along line A. FIG. 7 illustrates the cross-sectional view of the panel circuit structure 100 along line B. As shown in FIG. 6 and FIG. 7, the panel circuit structure 100 further includes an insulation layer 900 disposed on the panel 200 and covering the first transmission lines 800 and the second transmission lines 810. Furthermore, before the driving element 210 and transmission pads are disposed on the substrate 200, a plurality of first transmission apertures 910, first test apertures 920, second transmission apertures 930, and second test apertures 940 are formed on the insulation layer 900 to expose the first transmission lines 800 and the second transmission lines 810. The first transmission aperture 910 corresponds to the first transmission pad 310, and the first test aperture 920 corresponds to the first test pad 320. The second transmission aperture 930 corresponds to the second transmission pad 510, and the second test aperture 940 corresponds to the second test pad 520. Furthermore, the first transmission pad 310 passes through the corresponding first transmission aperture 910 and then electrically connects with the first transmission line 800. Similarly, the first test pad 320 passes through the corresponding first test aperture 920 and then electrically connects with the first transmission line 800. The second transmission pad 510 passes through the corresponding second transmission aperture 930 and electrically connects with the second transmission lines 810. The second test pad 520 passes through the corresponding second test aperture 940 and electrically connects with the second transmission line 810. The first transmission aperture 910 and the second transmission aperture 930 are preferably formed below the driving element 210, but are not limited thereto. The first test aperture 920 and the second test aperture 940 are preferably disposed outside the coverage of driving element 210 on the substrate 200. During the panel test, probes (not illustrated) are electrically connected to the first test pads 320 and the second test pads 520 in order to transmit the test signals to the active area.

As shown in FIG. 6 and FIG. 7, the third transmission pad 700 is electrically connected to both the driving element 210 and the third transmission line 710. The third transmission pad 700 receives external image signals from the third transmission line 710 and inputs the image signals into the driving element 210. The insulation layer 900 further includes third transmission apertures 950 corresponding to third transmission pads 700, wherein the third transmission pad 700 passes through the third transmission apertures 950 and electrically connects with the third transmission lines 710.

In the embodiment illustrated in FIG. 6 and FIG. 7, the first transmission pad 310 includes a first electrode 311 and a first conductor 312. One end of the first electrode 311 is electrically connected to the first end 211 of driving element 210, while the other end of the first electrode 311 is electrically connected to the first conductor 312. In other words, the first conductor 312 is disposed between the first electrode 311 and the first transmission line 800. The driving signal is outputted from driving element 210, passing through the first electrode 311, the first conductor 312, the first transmission line 800, and finally inputted into the active area (not illustrated). Furthermore, in the present embodiment, the first transmission pad 310 includes the first electrode 311 and the first conductor 312, wherein the first conductor 312 passes through the corresponding first transmission aperture 910 and electrically connected with the first transmission line 800. The first electrode 311 then electrically connects the first conductor 312 with one end of the driving element 210 to reduce the influence due to position shift of equipment in the manufacture process. Similarly, the second transmission pad 510 has a second electrode 511 and a second conductor 512 electrically connecting the first end 211 of driving element 210 to the second transmission line 810 in a manner similar to that used in the first transmission pad 310. The third transmission pad 700 has a third electrode 721 and a third conductor 722 electrically connecting the second end 212 of driving element 210 with the third transmission line 710. In this way, the test pad is disposed outside the coverage of the driving element 210 on the substrate 200, and the dimension of driving element 210 is no longer limited or influenced by positions of the first test pad 320 and the second test pad 520. Furthermore, materials of the first electrode 311, the first conductor 312, the second electrode 511, the second conductor 512, the third electrode 721, and the third conductor 722 include electrically conductive materials, such as indium tin oxide (ITO) or anisotropic conductive film (ACF), but are not limited thereto. Alternatively, the first electrode 311, the first conductor 312, the second electrode 511, the second conductor 512, the third electrode 721, and the third conductor 722 can include other known electrically conductive materials.

Figure 8:
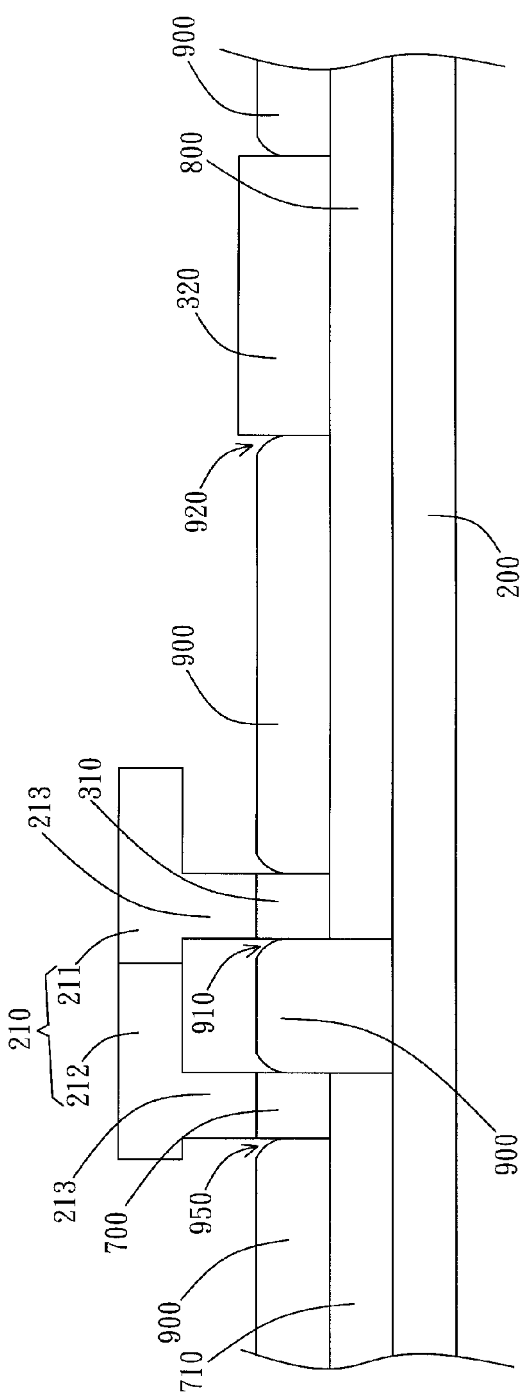
FIG. 8 and FIG. 9 are respectively cross-sectional views of the first transmission string and the second transmission string of another preferred embodiment of the present invention.
Figure 9:
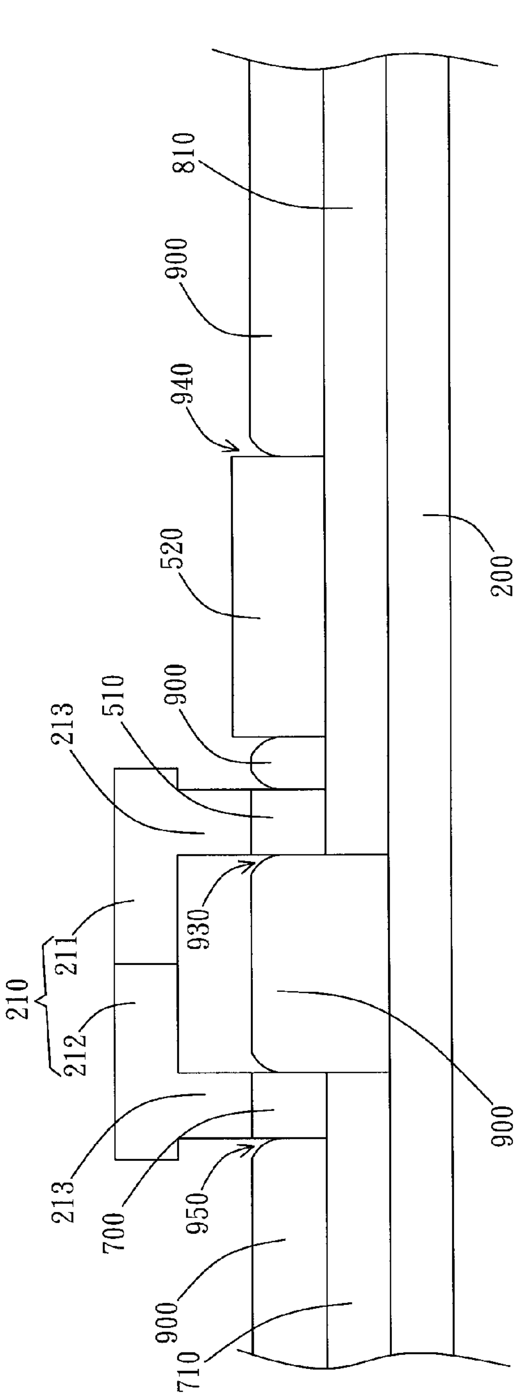

FIG. 8 and FIG. 9 illustrate modifications of the embodiments illustrated in FIG. 6 and FIG. 7. As shown in FIG. 8, the first end 211 and the second end 212 of the driving element 210 respectively includes a plurality of conductive connectors 213. The conductive connectors 213 are electrically connected to both the first transmission pad 310 and the second transmission pad 510. In the present embodiment, materials of the first transmission pad 310 and the second transmission pad 510 respectively include, for example, indium tin oxide (ITO) or anisotropic conductive film (ACF). Conductive connectors 213 can be disposed under the driving element 210. In other embodiments, the conductive connectors 213 can be disposed on the lateral surface or other suitable positions of the driving element 210. Other components of the panel circuit structure 100 and connections are similar to those in the previously described embodiments, and thus will not be discussed again.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A panel circuit structure, comprising:

a substrate;

a plurality of first transmission strings disposed on the substrate, wherein each of the plurality of first transmission strings includes:

a first transmission pad; and a first test pad electrically coupled with the first transmission pad; and a plurality of second transmission strings disposed on the substrate, wherein at least a part of the plurality of first transmission strings is spaced parallel to the plurality of second transmission strings, each of the plurality of second transmission strings includes:

a second transmission pad; and a second test pad electrically coupled with the second transmission pad, wherein each of the plurality of second transmission pad and the corresponding second test pad is disposed between the first transmission pads and the first test pads of the adjacent first transmission strings, the second transmission pad is closer to the first transmission pad than the second test pad is.

2. The panel circuit structure of claim 1, wherein at least one second transmission string is disposed between each of the plurality of first transmission strings and its closest adjacent first transmission string.

3. The panel circuit structure of claim 1, wherein at least two first transmission strings form a first transmission set, at least two second transmission strings form a second transmission set, each of the first transmission set is adjacent to one second transmission set.

4. The panel circuit structure of claim 1, further comprising a driving element disposed over the substrate, a first end of the driving element including a plurality of conductive connectors, respectively connected to the first transmission pad and the second transmission pad and covering the first transmission pad and the second transmission pad, wherein at least a part of the first test pad and at least a part of the second test pad are exposed outside the driving element.

5. The panel circuit structure of claim 4, further comprising a plurality of third transmission pads, disposed on the substrate corresponding to a second end of the driving element, the second end of the driving element including a plurality of conductive connectors respectively connected to and covering the third transmission pads, wherein the first transmission pad is closer to the third transmission pad than the first test pad, the second transmission pad, and the second test pad are, the second transmission pad is closer to the third transmission pad than the second test pad and the first test pad are.

6. The panel circuit structure of claim 1, wherein each of the first transmission strings includes a first transmission line connected respectively with the first transmission pad and the first test pad, each of the second transmission strings includes a second transmission line connected respectively with the second transmission pad and the second test pad, a length of the first transmission line between the corresponding first transmission pad and the first test pad is greater than a length of the second transmission line between the corresponding second transmission pad and the second test pad.

7. The panel circuit structure of claim 6, wherein each of the plurality of first transmission pads includes:

a first electrode electrically coupled with the driving element; and a first conductor disposed between the first electrode and the first transmission line, wherein one end of the first conductor is electrically connected to the first electrode, while the other end of the first conductor is electrically connected to the first transmission line.

8. The panel circuit structure of claim 6, wherein each of the plurality of second transmission pads includes:

a second electrode electrically connected with the driving element; and a second conductor disposed between the second electrode and the second transmission line, wherein one end of the second conductor is electrically connected to the second electrode, while the other end of the second conductor is electrically connected to the second transmission line.

9. The panel circuit structure of claim 6, further comprising an insulation layer disposed on the substrate, the plurality of first transmission lines, and the second transmission lines, the insulation layer includes:

a plurality of first transmission apertures disposed on the first transmission lines to expose the first transmission lines, the first transmission apertures provided for the first transmission pads to pass through and then electrically connect with the first transmission lines;

a plurality of first test apertures disposed on the first transmission lines to expose the first transmission lines, the first test apertures provided for the first test pads to pass through and then electrically connect with the first transmission lines;

a plurality of second transmission apertures disposed on the second transmission lines to expose the second transmission lines, the second transmission apertures provided for the second transmission pads to pass through and then electrically connect with the second transmission lines; and a plurality of second test apertures disposed on the second transmission lines to expose the second transmission lines, the second test apertures provided for the second test pads to pass through and electrically connect with the second transmission lines.

10. A panel circuit structure, comprising:

a first transmission row including a plurality of first transmission pads;

a second transmission row being parallel to the first transmission row and including a plurality of second transmission pads, wherein each of the second transmission pads is disposed between two corresponding adjacent first transmission pads;

a second test row parallel to the second transmission row, the second test row and the first transmission row are respectively disposed on two opposite sides of the second transmission row, the second test row including a plurality of second test pads, and each of the second test pad corresponding to and electrically connecting to each of the second transmission pads; and a first test row parallel to the first transmission row, the first test row and the second transmission pads respectively disposed on two opposite sides of the second test row, the first test row including a plurality of first test pads, wherein each of the first test pads is disposed between the adjacent second test pads and is electrically connected to each of the first transmission pads.

11. The panel circuit structure of claim 10, further comprising a driving element having an output end, the output end including a plurality of conductive connectors, respectively electrically connected to and covering the first transmission pads and the second transmission pads, wherein the first test pads and the second test pads are at least partly exposed outside the driving element.

* * * * *